United States Patent [19]

Bernot et al.

[11] 4,454,167

[45] Jun. 12, 1984

[54] PROCESS FOR GENERATING CONDUCTIVE PATTERNS

[75] Inventors: Anthony J. Bernot, Placentia; Kenneth Brown, Chino, both of Calif.

[73] Assignee: Beckman Instruments, Inc., Fullerton, Calif.

[21] Appl. No.: 395,202

[22] Filed: Jul. 6, 1982

[51] Int. Cl.³ .......................... H01B 1/08; B32B 15/00
[52] U.S. Cl. ........................ 427/96; 430/198; 430/319; 430/291; 430/315
[58] Field of Search .............. 427/96; 430/319, 198, 430/291, 315

[56] References Cited

U.S. PATENT DOCUMENTS

| | | | |
|---|---|---|---|
| 3,075,860 | 1/1963 | Veres | 427/96 |
| 3,355,291 | 11/1967 | Baird et al. | 430/198 |
| 4,119,480 | 10/1978 | Nishi et al. | 430/319 X |
| 4,148,761 | 4/1979 | Kazmierowicz | 252/512 |
| 4,239,813 | 12/1980 | Murakami et al. | 430/319 X |
| 4,371,598 | 2/1983 | Medernach et al. | 430/319 X |

Primary Examiner—Marion McCamish
Assistant Examiner—Nancy A. B. Swisher
Attorney, Agent, or Firm—R. J. Steinmeyer; F. L. Mehlhoff; A. A. Canzoneri

[57] ABSTRACT

A process for generating high resolution conductive patterns on an insulating substrate. A photosensitive resin coating applied to the surface of a substrate is exposed to a suitable light source through a mask. The unexposed portion of the coating defines the desired conductive pattern which is then coated with a low temperature melting glass powder. The substrate is fired to sinter the glass pattern and fuse it to the substrate. The substrate is then coated with a slurry of fine metal particles suspended in a volatilizable carrier. The substrate is again fired to sinter the metal into a united mass and causing it to fuse only with the low temperature melting glass pattern. The unadhered portions of the metal coating are removed by a washing operation. An exclusively metallic layer is thereby formed on a high resolution glass pattern intermediate layer supported by the substrate.

6 Claims, 9 Drawing Figures

PROCESS FOR GENERATING CONDUCTIVE PATTERNS

BACKGROUND OF THE INVENTION

This invention relates to a process for forming high resolution conducting patterns on an insulating substrate.

In the manufacture of certain electronic devices, it is necessary to provide a large number of circuit paths within a severely limited substrate area. This problem is encountered, for example, in making alphanumeric displays of the gas discharge type. In their most common form, displays of this type exhibit one or more lines of characters which may form words, or display other desired information. Each character is formed by a dot matrix array. During operation, the array is selectively energized so that the dots form the desired character.

Typically each dot matrix array comprises a matrix of thirty-five dots. A display may have forty or more such arrays, and the corresponding dots of each array are interconnected by a circuit path called an "address line." Thus, in addition to the requirements of other constituents of the display (there are, for example, forty anode electrodes), no less than thirty-five address lines are required for the dot elements. These lines must be grouped in an extremely crowded arrangement as dictated by the space constraints associated with a commercially acceptable display.

As in the case of certain other electronic circuits, it is essential that the address lines in a gas discharge display be highly conductive. In addition, the lines must be physically well defined to enable both the line width and the spacing between lines to be minimized. By so doing, a higher level of circuit density can be achieved, thereby accommodating a large number of address lines within a limited substrate area.

Commercial producers of thick film circuitry rely almost without exception upon screen printing for forming circuit paths on insulating substrates. It is because screen printing is efficient, easy to automate and therefore economical, that it has been almost universally adopted. Screen printing, however, cannot be reliably employed to produce line widths and line spacing smaller than 0.005 inches, as this is the practical limit of its resolution.

As a way of increasing the finite number of circuit paths that could be carried by a given area of a substrate, manufacturers have resorted to using multi-layer thick film structures. In such a structure, the circuit paths of a lower layer are isolated from the circuit paths of a higher layer by an intermediate dielectric layer. Since the fabrication of multi-layer structures entails multiple screening and firing operations, the manufacturing cost is for some applications considered prohibitive.

As to the use of other less traditional thick film metallization systems in critical applications such as have been described, none have been found to be capable of providing the desired line resolution at moderate cost. In some systems, high pattern resolution is achieved by the use of complex etching processes, which tend to be costly. In other systems, either the firing temperatures used are above the softening temperature of a glass substrate and therefore unsuitable, or the metallization used is a precious metal, rather than a base metal and therefore costly.

Thin film systems employing sputter or vapor deposition of circuit paths are likewise unsuited for applications such as the one considered here. These systems are comparatively inefficient, in that they are batch, rather than continuous fabrication processes. The thin film systems have the additional disadvantage of being capital intensive. That is to say, the implementation of such a system entails considerably greater equipment expense than the other systems which have been discussed.

It will be apparent, therefore, that there is a need for an economical process to form conductive patterns on glass substrates in accordance with the requirements which have been herein set forth. The present invention fulfills the need for an improvement in the metallization art by providing an economical process by which high resolution circuit patterns can be formed on substrates with the use of relatively low firing temperatures.

SUMMARY OF THE INVENTION

The present invention provides a process for generating high resolution conductive patterns on an insulating substrate. In the practice of the invention, a substrate is coated with a photosensitive resin and then exposed to a suitable light source through a mask. The mask contains the image of a desired conductive pattern so that exposure of the coating through the mask produces a corresponding unexposed pattern in the coating.

A low temperature melting glass powder is then rubbed over the coating. The glass powder adheres only to the unexposed pattern in the coating. The substrate is then fired at a temperature which is below the softening temperature of the substrate, but which is sufficiently high to sinter the glass powder. This firing produces a sintered glass pattern on the substrate and burns off the exposed coating.

A slurry is applied to the surface of the substrate containing the sintered glass pattern. The slurry comprises finely divided conductive metallic particles in a volatilizable carrier. The substrate and slurry are fired to sinter the conductive metallic particles, soften the sintered glass pattern and cause the metallic particles to adhere only to the sintered glass pattern. After firing, the substrate is washed to remove the conductive metallic particles not adhering to the sintered glass pattern.

DETAILED DESCRIPTION

Figure 1:
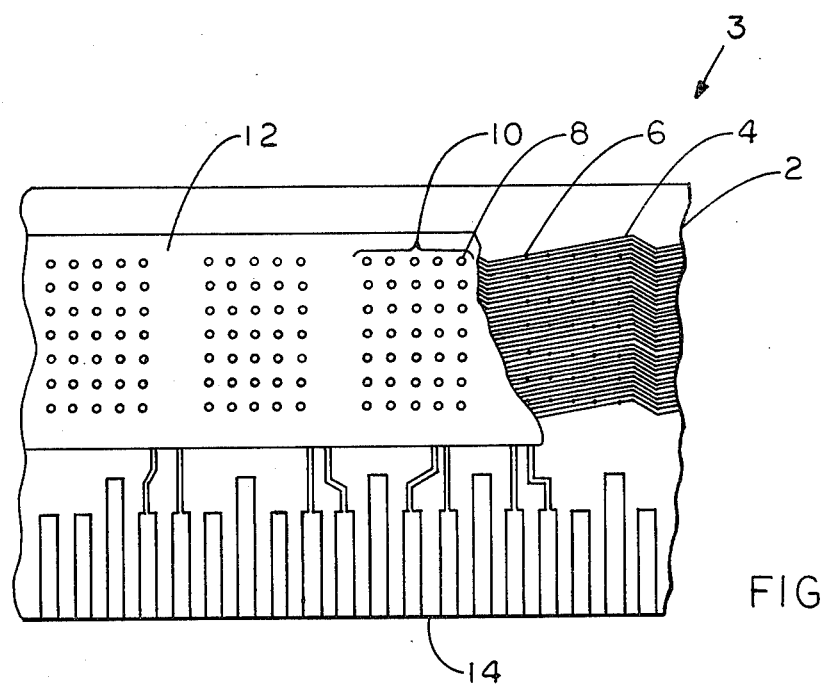
FIG. 1 is a partial plan view of a display device having a conductive pattern embodying the invention.

In FIG. 1, there is shown one of the many possible circuit applications in which the process of the present invention may be advantageously employed. In the example illustrated, a portion of a display device 3 is shown and has a substrate 2, a plurality of dot matrices 10 and a plurality of address line conductors 4. Each matrix 10 is composed of an array of dot elements 6 which are covered by a dielectric layer 12 having a like pattern of apertures 8 through which the dot elements are exposed. The arrangement of the matrix circuitry is such that corresponding dot elements 6 of each matrix are interconnected by address line conductors 4. Each address line 4 is connected at a point (not shown) underneath the dielectric coating 12 to an edge terminal 14.

Practical size constraints applying to the display device 3 severely limit the size of the area that can be occupied by address line conductors 4. The conductors, therefore, are constructed to have a line width and line spacing of approximately 0.002 inches, respectively. To employ line widths and spacings of this order necessarily requires a high order of line definition to assure circuit continuity and avoid short circuits between adjacent lines. The process for forming such conductor lines in accordance with the present invention will now be described.

Figure 2:
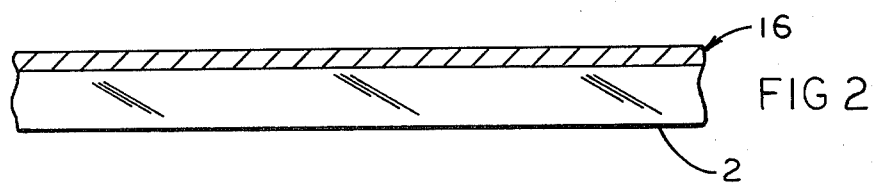
FIGS. 2-9, inclusive, are enlarged schematic cross-sectional views of a substrate and the various stages in the generation of a conductive pattern in accordance with the preferred practice of the invention.

Referring now to FIG. 2, the substrate 2 is a soda-lime glass plate which has been coated with a suitable positive-acting photosensitive resin 16. Preferably, the resin is of a type which hardens upon exposure to UV (ultraviolet) radiation. One such resin is manufactured by Ferro Corporation and sold under the trade name of MID-FILM.

Figure 3:
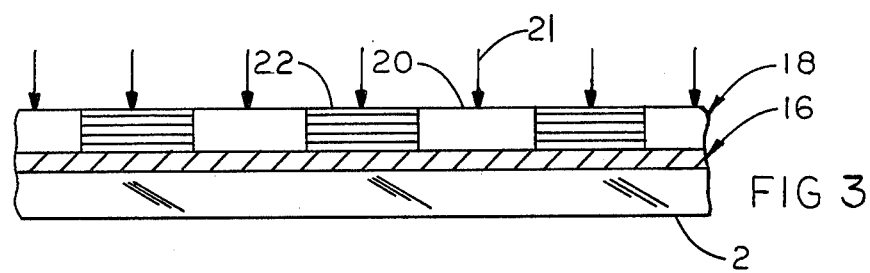

Referring now to FIG. 3, a mask 18 is positioned over the coating 16 and exposed to a suitable light source. The mask 18 has clear areas 20 through which light rays 21 are able to pass to reach the coating 16. The mask 18 also contains opaque areas 22 configured according to the desired conductor pattern, and through which the light rays 21 cannot pass. Currently, the most practical method for producing the mask 18 is by a conventional photoreduction process to produce a mask in the form of a positive plate or transparency, although the production of masks by other methods such as by laser scribing may also be possible.

Figure 4:
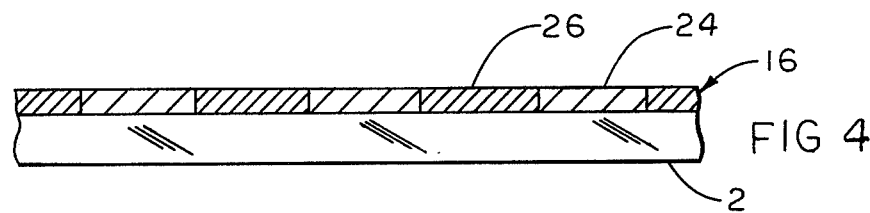

Referring now to FIG. 4, the substrate 2 and the coating 16 are shown with a mask 18 removed after the exposure to the light source. The exposed portions 26 of the coating 16 have polymerized or otherwise become hardened by the exposure. The unexposed portions 24 of the coating 16 are unchanged, and they retain the original soft consistency of the unhardened coating.

Figure 5:
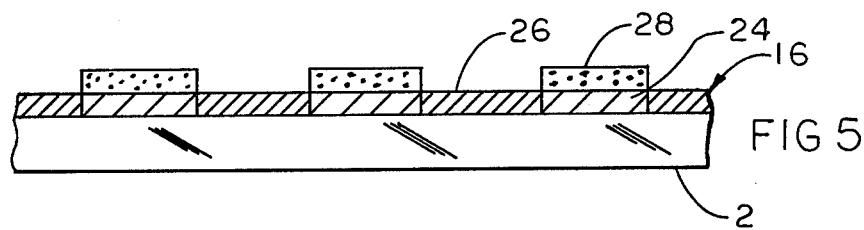

Referring now to FIG. 5, the next step of the process is to lightly rub powdered glass 28 over the surface of the coating 16. The powdered glass does not adhere to the exposed portions 26 which have a hard surface, but rather, the glass adheres to the unexposed portions 24 which remain in their original soft state.

The powdered glass 28 is a low temperature melting glass belonging to the class of glasses generally designated as "solder glasses." Solder glasses typically have a high lead content which enables flow to occur at a lower temperature than in other glasses. Numerous glasses of this type are available commercially, in a wide range of melting temperatures. In selecting a glass suitable for use in the present process, it is only necessary to ascertain that the sintering temperature of the glass is comfortably below the softening temperature of the substrate upon which it is to be applied; and that the melting temperature of the glass is higher than the sintering temperature of the metallization that is to be employed. The solder glass is prepared for use by grinding it into a powder fine enough to pass through a 400 mesh screen. The grinding may be suitably accomplished by the use of a ball mill.

Figure 6:
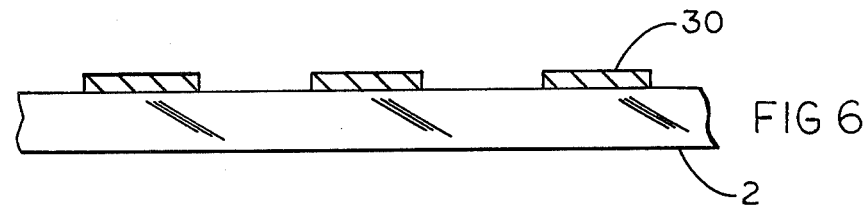

With reference now to FIG. 6, the next step following the application of the powdered glass 28 to the unexposed portions 24 of the coating 16 is to fire the substrate 2. As has been stated, this firing is carried out at a temperature below the softening temperature of the substrate but yet high enough to sinter the powdered glass 28. (As used herein, the term "sinter" is defined as to coalesce into a single mass under the influence of heat, without actually liquefying.) During the course of the firing, the resin coating 16 is burned off, and the powdered glass 28 unites into a single mass of sintered solder glass 30, and fuses to the surface of substrate 2.

Figure 7:
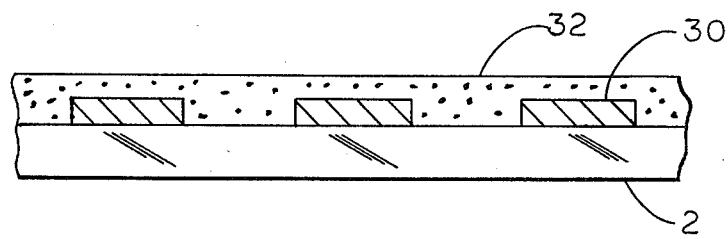

Referring now to FIG. 7, a metallizing slurry 32 has been deposited over the sintered glass 30. The metallizing slurry 32 comprises finely divided metal particles of about 5μ (micrometer) particle size suspended in an inert volatilizable carrier. The carrier may be almost any liquid capable of suspending the metal and being evaporated afterward, such as isopropyl alcohol. Ideally, the carrier may be selected upon the basis of specific gravity, viscosity, drying rate and other considerations depending upon the specific mode of application to the solder glass 30. For example, it may be desired to deposit the slurry 32 on the substrate 2 by spraying. In such a case, different rheology characteristics would be desired than for application by screen printing.

In FIG. 7, the slurry 32 is shown covering the entire upper surface of substrate 2. While it might be thought advantageous to screen print the slurry only on top of the sintered glass pattern 30, it should be noted that the resolution capability of the process is such that the fineness of the pattern may far exceed the resolution of the screen printing process. Thus, in the case of a very fine pattern, it would be impossible to screen print only over the pattern. A possible alternative to screen printing or spraying the slurry over the entire pattern surface might be to dip coat the substrate. However, this would likely prove to be less efficient than either of the former processes.

In the case where the substrate is soda-lime glass, the metal particles may be either a mixture or alloy consisting of aluminum in the range of about 98–70% and silicon in the range of about 2–30%, and preferably within the range of from 90–87% aluminum and 10–13% silicon. This two-metal metallizing system has the advantage of sintering at temperatures in the range from about 580° to about 620° C. in air.

In cases where the substrate is capable of withstanding higher temperatures, the metal part of the slurry 32 may consist entirely of aluminum. The aluminum may be sintered by firing at a temperature of about 610°–650° C. in air.

Figure 8:
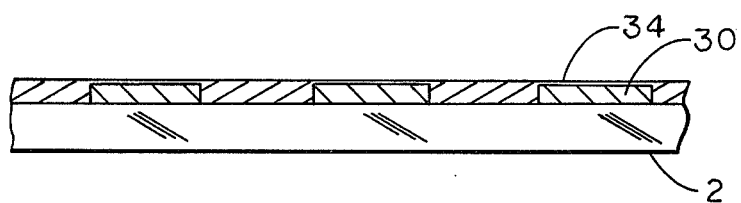

Referring now to FIG. 8, the substrate 2 is shown after firing. As shown, the firing has transformed the slurry into a sintered metallic residue 34 which is fused to the surface of the solder glass pattern 30. During firing, the carrier of the slurry is volatilized, and the metal powder becomes unified as a coating of sintered metal 34. As the selected firing temperature is lower than the softening temperature of the substrate, there is no strong adhesion between the metal and the substrate. The firing temperature, however, is selected to be above the softening temperature of the solder glass pattern 30 with the result that the sintered metal 34 fuses with the surface of the solder glass 30. The substrate is then washed or brushed to remove the sintered metal 34 which is not adhered to the solder glass pattern 30.

Figure 9:
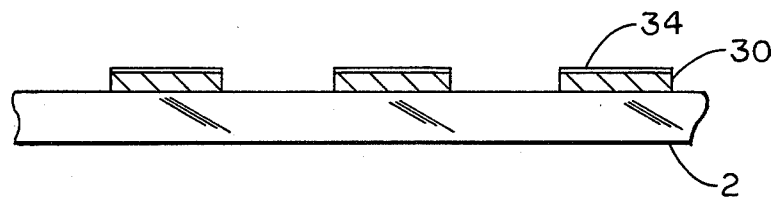

The finished conductor pattern is shown in FIG. 9, wherein the substrate 2 supports a solder glass pattern 30 having a highly conductive sintered metal surface 34. If desired, the substrate may be subjected to a post-firing to further develop the grain structure of the metallization. Such additional development will increase the conductivity of the metallization. Thus, by the process which has been described, extremely fine line closely packed circuits can be fabricated. Unlike screen printing, the present process produces lines having a width and spacing therebetween of less than 0.005 inches without difficulty. The resolving limit of the present process has not yet been ascertained; however, it has been found that the process is capable of reliably producing lines of 0.002 inches width with corresponding spacing between lines.

While numerous references have been made herein to the softening temperature of soda-lime glass substrates and to the softening temperature of solder glasses, it should be understood that it is impractical to specify the temperature at which this condition occurs. The reason is that no precise definition of such softening point exists or is known to exist and, in any case, the temperature would be different for each specific glass composition. Attention is also directed to the fact that the firing temperatures which have been given are for air firing and that these temperatures may be advantageously reduced by performing the firing in an inert or reducing atmosphere.

While the process of the present invention is distinguished from the other known processes in a number of important respects that have already been iterated, it should also be noted that the present process avoids virtually all of the complexities of the prior art processes. The firing steps, for example, are carried out in air; and materials and equipment required are of the simplest, most basic kind. The process is not limited to use with glass substrates, but can also be used with ceramic substrates of any type.

Attention is also directed to the fact that, unlike the product of conventional thick film processes in which the conductor comprises a metal or metal oxide in a glass or ceramic matrix, the conductor of the present invention is an exclusively metal layer, laminated to a substrate by an intermediate glass layer. As a consequence, it exhibits higher conductivity and exhibits numerous other advantages, such as being more readily plateable with other metals.

While in accordance with the patent statutes there has been described what at present is considered to be the preferred embodiment of the invention, it will be understood by those skilled in the art that various changes and modifications may be made therein without departing from the invention and it is, therefore, the aim of the appended claims to cover all such changes and modifications as fall within the true spirit and scope of the invention.

What is claimed is:

1. A process for generating a high resolution conductive pattern on an insulating substrate comprising the steps of:
   providing a photosensitive resin;
   applying said resin to at least one surface of said substrate for providing a coating thereon;
   providing a mask containing the image of a desired conductive pattern and a suitable light source for exposing said coating;
   exposing said coating to said light source through said mask producing an unexposed pattern in said coating;
   providing a low temperature melting solder glass powder;
   rubbing said glass powder over said coating, said powder adhering only to the unexposed pattern in said coating;
   firing said substrate at a temperature below the softening temperature of said substrate but sufficiently high to sinter said glass powder to produce a sintered glass pattern on said substrate and burn off said coating;
   providing a slurry comprising conductive metallic particles in a volatilizable carrier;
   applying said slurry to the entire surface of said substrate containing said sintered glass pattern;
   firing said substrate and slurry at a temperature below the softening temperature of said substrate to sinter said conductive metallic particles, soften said sintered glass pattern and causing said metallic particles to adhere only to said sintered glass pattern; and
   removing the conductive metallic particles not adhering to said sintered glass pattern.

2. The process defined in claim 1 wherein said conductive metallic particles are aluminum.

3. The process defined in claim 1 wherein said conductive metallic particles comprise a mixture consisting of aluminum particles in the range of from 90–80% and silicon particles in the range of from 10–20%.

4. The process defined in claim 1 wherein said conductive metallic particles comprise a mixture consisting of aluminum particles in the range of from 90–87% and silicon particles in the range of from 10–13%.

5. The process defined in claim 1 wherein said conductive particles comprise an alloy consisting of aluminum in the range of from 90–80% and silicon in the range of from 10–20%.

6. The process defined in claim 1 wherein said conductive particles comprise an alloy consisting of aluminum in the range of from 90–87% and silicon in the range of from 10–13%.

* * * * *